US011423529B2

(12) United States Patent
Girmonsky et al.

(10) Patent No.: US 11,423,529 B2
(45) Date of Patent: Aug. 23, 2022

(54) DETERMINATION OF DEFECT LOCATION FOR EXAMINATION OF A SPECIMEN

(71) Applicant: Applied Materials Israel Ltd., Rehovot (IL)

(72) Inventors: Doron Girmonsky, Raanana (IL); Rafael Ben Ami, Ramat Gan (IL); Boaz Cohen, Lehavim (IL); Dror Shemesh, Hod Hasharon (IL)

(73) Assignee: Applied Materials Isreal Ltd., Rehovot (IL)

( * ) Notice: Subject to any disclaimer, the term of this patent is extended or adjusted under 35 U.S.C. 154(b) by 0 days.

(21) Appl. No.: 16/794,172

(22) Filed: Feb. 18, 2020

(65) Prior Publication Data

US 2021/0256687 A1 Aug. 19, 2021

(51) Int. Cl.
*G06T 7/00* (2017.01)
*G06F 17/18* (2006.01)

(52) U.S. Cl.
CPC ............ *G06T 7/0008* (2013.01); *G06F 17/18* (2013.01); *G06T 7/001* (2013.01); *G06T 2207/10152* (2013.01); *G06T 2207/20076* (2013.01); *G06T 2207/20224* (2013.01); *G06T 2207/30148* (2013.01)

(58) Field of Classification Search
CPC .................. G06T 7/0008; G06T 7/001; G06T 2207/20076; G06T 2207/20224; G06T 2207/30148; G06T 2207/10152; G06F 17/18

USPC ......................................................... 382/100
See application file for complete search history.

(56) References Cited

U.S. PATENT DOCUMENTS

| | | | | |
|---|---|---|---|---|
| 7,271,891 | B1 * | 9/2007 | Xiong | G01N 21/9501 250/559.39 |
| 2002/0156550 | A1 * | 10/2002 | Langford | G01R 31/2831 700/109 |
| 2017/0242425 | A1 * | 8/2017 | Buhl | G05B 19/4188 |
| 2018/0203439 | A1 * | 7/2018 | Hattori | G05B 23/0221 |
| 2019/0033838 | A1 * | 1/2019 | Duffy | G05B 19/41875 |
| 2019/0244336 | A1 * | 8/2019 | Wakisaka | G06T 7/0006 |

OTHER PUBLICATIONS

PCT International Search Report and Written Opinion for International Application No. PCT/IL2020/051144 dated Feb. 8, 2021, 12 pages.

* cited by examiner

*Primary Examiner* — Amandeep Saini
(74) *Attorney, Agent, or Firm* — Lowenstein Sandler LLP

(57) ABSTRACT

There is provided a method and a system configured to obtain an image of a one or more first areas of a semiconductor specimen acquired by an examination tool, determine data $D_{att}$ informative of defectivity in the one or more first areas, determine one or more second areas of the semiconductor specimen for which presence of a defect is suspected based at least on an evolution of $D_{att}$, or of data correlated to $D_{att}$, in the one or more first areas, and select the one or more second areas for inspection by the examination tool.

20 Claims, 6 Drawing Sheets

| 331 | 340 | 341 | 332 | | | 333 |
|---|---|---|---|---|---|---|
| | | | | | | |
| | | | | | | |
| 334 | | | 335 | | | 336 |
| | | | | | | |
| | | | | | | |
| 337 | | | 338 | | | 339 |

DETERMINATION OF DEFECT LOCATION FOR EXAMINATION OF A SPECIMEN

TECHNICAL FIELD

The presently disclosed subject matter relates, in general, to the field of examination of a specimen, and more specifically, to automating the examination of a specimen.

BACKGROUND

Current demands for high density and performance associated with ultra large scale integration of fabricated devices require submicron features, increased transistor and circuit speeds, and improved reliability. Such demands require formation of device features with high precision and uniformity, which, in turn, necessitates careful monitoring of the fabrication process, including automated examination of the devices while they are still in the form of semiconductor wafers.

Examination processes are used at various steps during semiconductor fabrication to detect and classify defects on specimens. Effectiveness of examination can be increased by automatization of process(es) as, for example, Automatic Defect Classification (ADC), Automatic Defect Review (ADR), etc.

GENERAL DESCRIPTION

In accordance with certain aspects of the presently disclosed subject matter, there is provided a system of examination of a semiconductor specimen, the system comprising a processor and memory circuitry (PMC) configured to obtain an image of one or more first areas of a semiconductor specimen acquired by an examination tool, determine data $D_{att}$ informative of defectivity in the one or more first areas, determine one or more second areas of the semiconductor specimen for which presence of a defect is suspected based at least on an evolution of $D_{att}$, or of data correlated to $D_{att}$, in the one or more first areas, and select the one or more second areas for inspection by the examination tool.

According to some embodiments, determination of the one or more second areas is based on a search of an extremum of $D_{att}$.

According to some embodiments, the system is configured to determine $D_{correl}$ representative of a correlation between data $D_{att}$ informative of defectivity in the one or more first areas, and data representative of a thickness of the semiconductor specimen in the one or more first areas, determine one or more second areas of the semiconductor specimen for which presence of a defect is suspected, wherein the one or more second areas are determined based on $D_{correl}$, or data representative thereof, and data representative of a thickness of the semiconductor specimen, and select the one or more second areas for inspection by the examination tool.

According to some embodiments, the system is configured to perform repeatedly (1), (2), (3) and (4), from i equal to 1, until a stopping criterion is met: (1) obtain an image of one or more areas $A_i$ of a semiconductor specimen acquired by an examination tool, (2) determine data $D_{att}$ informative of defectivity in the one or more areas $A_i$, (3) determine one or more areas $A_{i+1}$ of the semiconductor specimen for which presence of a defect is suspected, based at least on an evolution of $D_{att}$ in the one or more areas $A_i$, and (4) reverting to (1) for i incremented by one.

According to some embodiments, the system is configured to generate for each of a plurality of subsets of pixels present in the image of the semiconductor specimen, a probability that a defect is present at each subset, wherein the second area is selected based at least on the probability, wherein the probability is based on at least one of and (i) and (ii): (i) data $D_{att}$ informative of defectivity in the one or more first areas; and (ii) data $D_{correl}$ representative of a correlation between data $D_{att}$ informative of defectivity in the one or more first areas and data representative of a thickness of the semiconductor specimen in the one or more first areas, and data representative of a thickness of the semiconductor specimen.

According to some embodiments, data $D_{att}$ in the one or more first areas includes at least one of: data representative of a shape of elements present in the one or more first areas, and data representative of a difference between elements present in the one or more first areas and elements present in a reference image of the one or more first areas.

According to some embodiments, if data $D_{correl}$ includes a function F which depends on data representative of a thickness of the semiconductor specimen over a range R, the system is configured to select the second area such that at least one of (i), (ii) and (iii) is met:
  (i) data representative of a thickness of the semiconductor specimen in the second area complies with the function F in the range R;
  (ii) data representative of a thickness of the semiconductor specimen in the second area allows testing the function F over a range R' different from R; and
  (iii) data representative of a thickness of the semiconductor specimen in the second area is selected to attempt to move towards an extremum of an output of the function F.

According to some embodiments, at least one of data representative of a thickness of the semiconductor specimen in the one or more first areas, and data representative of a thickness of the semiconductor specimen, is obtained based on pixel intensity in an image acquired by at least one optical examination tool.

According to some embodiments, at least one of data representative of a thickness of the semiconductor specimen in the one or more first areas and data representative of a thickness of the semiconductor specimen is obtained based on pixel intensity in a plurality of images acquired by at least one optical examination tool, wherein the plurality of images differ by a wavelength of an illuminating optical signal of the optical examination tool.

According to some embodiments, the system is configured to select the one or more first areas based on a first probability map representing probability of a presence of defects over the semiconductor specimen, wherein the first probability map is built based on at least one of an image of the semiconductor specimen acquired by an optical examination tool, estimation of defect location based on an image of the semiconductor specimen acquired by an optical examination tool, historical data regarding defect location, an image of the semiconductor specimen acquired by an electron beam examination tool, a simulated image of the semiconductor specimen, a synthetic image of the semiconductor specimen, and manufacturing data of the semiconductor specimen.

According to some embodiments, at least one of data representative of a thickness of the semiconductor specimen in the one or more first areas and data representative of a thickness of the semiconductor specimen, is obtained based on pixel intensity in an image acquired by at least one optical examination tool.

According to some embodiments, at least one of data representative of a thickness of the semiconductor specimen in the one or more first areas and data representative of a thickness of the semiconductor specimen is obtained based on pixel intensity in a plurality of images acquired by at least one optical examination tool, wherein the plurality of images differ by a wavelength of an illuminating optical signal of the optical examination tool.

In accordance with certain aspects of the presently disclosed subject matter, there is provided a method of examination of a semiconductor specimen, the method comprising, by a processor and memory circuitry (PMC): obtaining an image of one or more first areas of a semiconductor specimen acquired by an examination tool, determining data $D_{att}$ informative of defectivity in the one or more first areas, determining one or more second areas of the semiconductor specimen for which presence of a defect is suspected based at least on an evolution of $D_{att}$, or of data correlated to $D_{att}$, in the one or more first areas, and selecting the one or more second areas for inspection by the examination tool.

In accordance with other aspects of the presently disclosed subject matter, there is provided a non-transitory computer readable medium comprising instructions that, when executed by a computer, cause the computer to perform the method above.

According to some embodiments, the proposed solution allows efficient examination of a specimen including small structures, for which signal to noise ratio (in an image acquired e.g. by an optical examination tool) is low. According to some embodiments, the proposed solution copes with contradictory requirements: efficient use of a low-speed high-resolution examination tool for examination of a specimen (this tool is required in particular for examination of small structures, but can inspect only a small area of the specimen in a reasonable time), in a limited time and budget. According to some embodiments, the proposed solution allows directing an examination tool in a smart and efficient way towards relevant areas of a specimen. According to some embodiments, the proposed solution optimizes time and cost required for examination of a specimen.

BRIEF DESCRIPTION OF THE DRAWINGS

In order to understand the disclosure and to see how it may be carried out in practice, embodiments will now be described, by way of non-limiting example only, with reference to the accompanying drawings, in which.

DETAILED DESCRIPTION OF EMBODIMENTS

Figure 1:
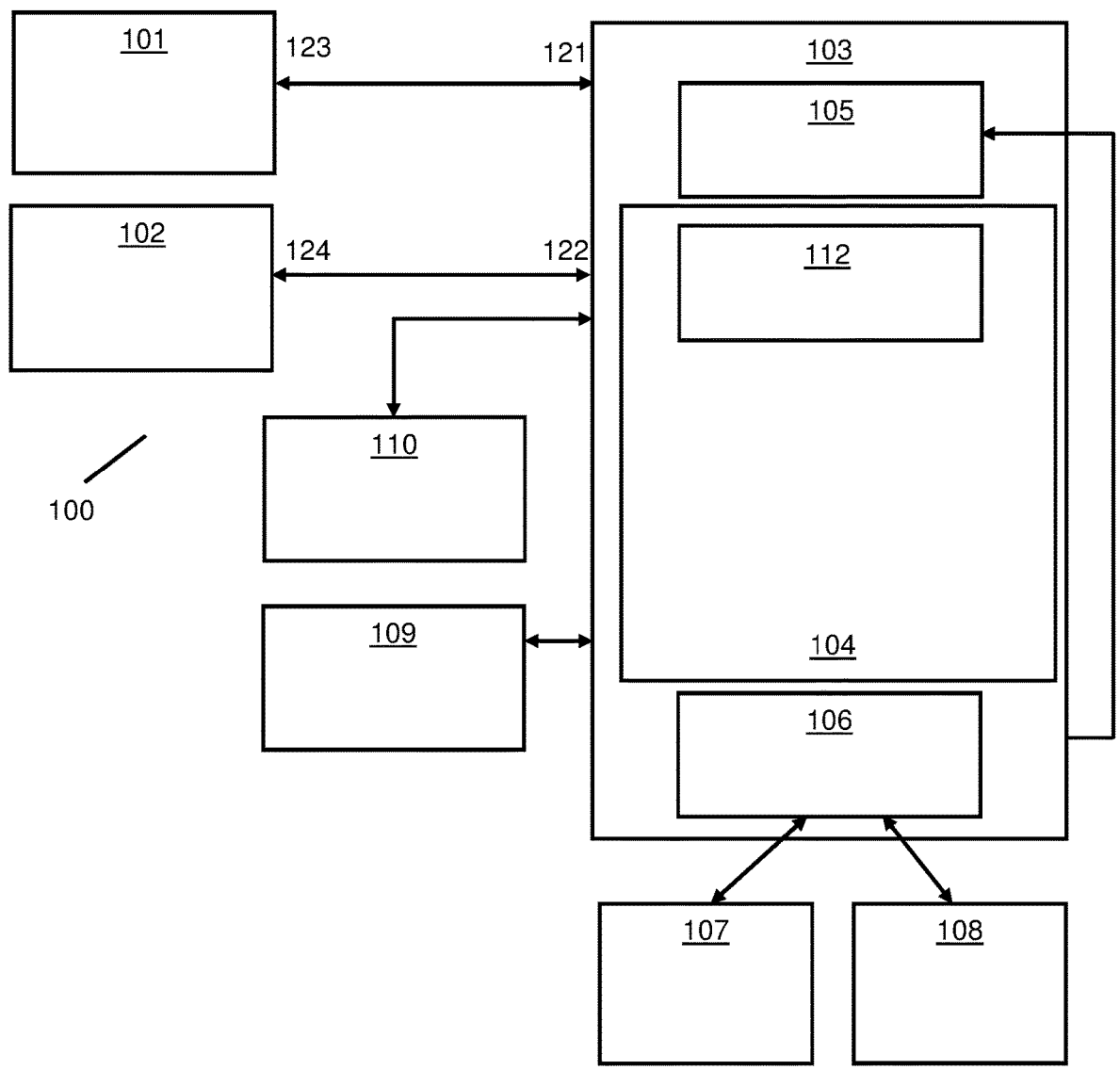
FIG. 1 illustrates a generalized block diagram of an examination system in accordance with certain embodiments of the presently disclosed subject matter.

In the following detailed description, numerous specific details are set forth in order to provide a thorough understanding of the disclosure. However, it will be understood by those skilled in the art that the presently disclosed subject matter may be practiced without these specific details. In other instances, well-known methods, procedures, components and circuits have not been described in detail so as not to obscure the presently disclosed subject matter.

Unless specifically stated otherwise, as apparent from the following discussions, it is appreciated that throughout the specification discussions utilizing terms such as "processing", "obtaining", "selecting", "determining", "generating", "outputting" or the like, refer to the action(s) and/or process(es) of a computer that manipulate and/or transform data into other data, said data represented as physical, such as electronic, quantities and/or said data representing the physical objects. The term "computer" should be expansively construed to cover any kind of hardware-based electronic device with data processing capabilities including, by way of non-limiting example, the system 103 and respective parts thereof disclosed in the present application.

The terms "non-transitory memory" and "non-transitory storage medium" used herein should be expansively construed to cover any volatile or non-volatile computer memory suitable to the presently disclosed subject matter.

The term "specimen" used in this specification should be expansively construed to cover any kind of wafer, masks, and other structures, combinations and/or parts thereof used for manufacturing semiconductor integrated circuits, magnetic heads, flat panel displays, and other semiconductor-fabricated articles.

The term "examination" used in this specification should be expansively construed to cover any kind of metrology-related operations as well as operations related to detection and/or classification of defects in a specimen during its fabrication. Examination is provided by using non-destructive examination tools during or after manufacture of the specimen to be examined. By way of non-limiting example, the examination process can include runtime scanning (in a single or in multiple scans), sampling, reviewing, measuring, classifying and/or other operations provided with regard to the specimen or parts thereof using the same or different inspection tools. Likewise, examination can be provided prior to manufacture of the specimen to be examined and can include, for example, generating an examination recipe(s) and/or other setup operations. It is noted that, unless specifically stated otherwise, the term "examination" or its derivatives used in this specification are not limited with respect to resolution or size of an inspection area. A variety of non-destructive examination tools includes, by way of non-limiting example, scanning electron microscopes, atomic force microscopes, optical inspection tools, etc.

By way of non-limiting example, run-time examination can employ a two phase procedure, e.g. inspection of a specimen followed by review of sampled locations of potential defects. During the first phase, the surface of a specimen is inspected at high-speed and relatively low-resolution. In the first phase, a defect map is produced to show suspected locations on the specimen having high probability of a defect. During the second phase at least part of the suspected locations are more thoroughly analyzed with relatively high resolution. In some cases both phases can be implemented by the same inspection tool, and, in some other cases, these two phases are implemented by different inspection tools.

The term "defect" used in this specification should be expansively construed to cover any kind of abnormality or undesirable feature formed on or within a specimen.

The term "design data" used in the specification should be expansively construed to cover any data indicative of hierarchical physical design (layout) of a specimen. Design data can be provided by a respective designer and/or can be derived from the physical design (e.g. through complex simulation, simple geometric and Boolean operations, etc.). Design data can be provided in different formats such as, by way of non-limiting examples, GDSII format, OASIS format, etc. Design data can be presented in vector format, grayscale intensity image format, or otherwise.

It is appreciated that, unless specifically stated otherwise, certain features of the presently disclosed subject matter, which are described in the context of separate embodiments, can also be provided in combination in a single embodiment. Conversely, various features of the presently disclosed subject matter, which are described in the context of a single embodiment, can also be provided separately or in any suitable sub-combination. In the following detailed description, numerous specific details are set forth in order to provide a thorough understanding of the methods and apparatus.

Bearing this in mind, attention is drawn to FIG. 1 illustrating a functional block diagram of an examination system in accordance with certain embodiments of the presently disclosed subject matter. The examination system 100 illustrated in FIG. 1 can be used for examination of a specimen (e.g. of a wafer and/or parts thereof) as a part of the specimen fabrication process. The illustrated examination system 100 comprises computer-based system 103 capable of automatically determining metrology-related and/or defect-related information using images obtained during specimen fabrication. System 103 can be operatively connected to one or more low-resolution examination tools 101 and/or one or more high-resolution examination tools 102 and/or other examination tools. The examination tools are configured to capture images and/or to review the captured image(s) and/or to enable or provide measurements related to the captured image(s). System 103 can be further operatively connected to CAD server 110 and data repository 109.

System 103 includes a processor and memory circuitry (PMC) 104 operatively connected to a hardware-based input interface 105 and to a hardware-based output interface 106. PMC 104 is configured to provide all processing necessary for operating the system 103 as further detailed hereinafter (see methods described in FIGS. 3 to 5, which can be performed at least partially by system 103) and includes a processor (not shown separately) and a memory (not shown separately). The processor of PMC 104 can be configured to execute several functional modules in accordance with computer-readable instructions implemented on a non-transitory computer-readable memory comprised in the PMC. Such functional modules are referred to hereinafter as comprised in the PMC. Functional modules comprised in PMC 104 include a deep neural network (DNN) 112. DNN 112 is configured to enable data processing using a machine learning algorithm for outputting application-related data based on the images of specimens.

By way of non-limiting example, the layers of DNN 112 can be organized in accordance with Convolutional Neural Network (CNN) architecture, Recurrent Neural Network architecture, Recursive Neural Networks architecture, Generative Adversarial Network (GAN) architecture, or otherwise. Optionally, at least some of the layers can be organized in a plurality of DNN sub-networks. Each layer of the DNN can include multiple basic computational elements (CE), typically referred to in the art as dimensions, neurons, or nodes.

Generally, computational elements of a given layer can be connected with CEs of a preceding layer and/or a subsequent layer. Each connection between a CE of a preceding layer and a CE of a subsequent layer is associated with a weighting value. A given CE can receive inputs from CEs of a previous layer via the respective connections, each given connection being associated with a weighting value which can be applied to the input of the given connection. The weighting values can determine the relative strength of the connections and thus the relative influence of the respective inputs on the output of the given CE. The given CE can be configured to compute an activation value (e.g. the weighted sum of the inputs) and further derive an output by applying an activation function to the computed activation. The activation function can be, for example, an identity function, a deterministic function (e.g., linear, sigmoid, threshold, or the like), a stochastic function, or other suitable function. The output from the given CE can be transmitted to CEs of a subsequent layer via the respective connections. Likewise, as above, each connection at the output of a CE can be associated with a weighting value which can be applied to the output of the CE prior to being received as an input of a CE of a subsequent layer. Further to the weighting values, there can be threshold values (including limiting functions) associated with the connections and CEs.

The weighting and/or threshold values of DNN 112 can be initially selected prior to training, and can be further iteratively adjusted or modified during training to achieve an optimal set of weighting and/or threshold values in a trained DNN. After each iteration, a difference (also called loss function) can be determined between the actual output produced by DNN 112 and the target output associated with the respective training set of data. The difference can be referred to as an error value. Training can be determined to be complete when a cost or loss function indicative of the error value is less than a predetermined value, or when a limited change in performance between iterations is achieved. Optionally, at least some of the DNN subnetworks (if any) can be trained separately, prior to training the entire DNN.

System 103 is configured to receive, via input interface 105, input data. Input data can include data (and/or derivatives thereof and/or metadata associated therewith) produced by the examination tools and/or data produced and/or stored in one or more data repositories 109 and/or in CAD server 110 and/or another relevant data depository. It is noted that input data can include images (e.g. captured images, images derived from the captured images, simulated images, synthetic images, etc.) and associated numeric data (e.g. metadata, hand-crafted attributes, etc.). It is further noted that image data can include data related to a layer of interest and/or to one or more other layers of the specimen.

System 103 is further configured to process at least part of the received input data and send, via output interface 106, the results (or part thereof) to a storage system 107, to examination tool(s), to a computer-based graphical user interface (GUI) 108 for rendering the results and/or to external systems (e.g. Yield Management System (YMS) of a FAB). GUI 108 can be further configured to enable user-specified inputs related to operating system 103.

By way of non-limiting example, a specimen can be examined by one or more low-resolution examination machines 101 (e.g. an optical inspection system, low-resolution SEM, etc.). The resulting data (referred to hereinafter as low-resolution image data 121), informative of low-resolution images of the specimen, can be transmitted—directly or via one or more intermediate systems—to system 103. Alternatively or additionally, the specimen can be examined by a high-resolution machine 102 (e.g. a subset of potential defect locations selected for review can be reviewed by a scanning electron microscope (SEM) or Atomic Force Microscopy (AFM)). The resulting data (referred to hereinafter as high-resolution image data 122) informative of high-resolution images of the specimen can be transmitted—directly or via one or more intermediate systems—to system 103.

It is noted that images of a desired location on a specimen can be captured at different resolutions. By way of non-limiting example, so-called "defect images" of the desired location are usable to distinguish between a defect and a false alarm, while so-called "class images" of the desired location are obtained with higher resolution and are usable for defect classification. In some embodiments, images of the same location (with the same or different resolutions) can comprise several images registered therebetween (e.g. images captured from the given location and one or more reference images corresponding to the given location).

It is noted that image data can be received and processed together with metadata (e.g. pixel size, text description of defect type, parameters of image capturing process, etc.) associated therewith.

Upon processing the input data (e.g. low-resolution image data and/or high-resolution image data, optionally together with other data as, for example, design data, synthetic data, etc.), system 103 can send the results (e.g. instruction-related data 123 and/or 124) to any of the examination tool(s), store the results (e.g. defect attributes, defect classification, etc.) in storage system 107, render the results via GUI 108 and/or send to an external system (e.g. to YMS).

Those versed in the art will readily appreciate that the teachings of the presently disclosed subject matter are not bound by the system illustrated in FIG. 1; equivalent and/or modified functionality can be consolidated or divided in another manner and can be implemented in any appropriate combination of software with firmware and/or hardware.

Without limiting the scope of the disclosure in any way, it should also be noted that the examination tools can be implemented as inspection machines of various types, such as optical imaging machines, electron beam inspection machines and so on. In some cases the same examination tool can provide low-resolution image data and high-resolution image data. In some cases at least one examination tool can have metrology capabilities.

It is noted that the examination system illustrated in FIG. 1 can be implemented in a distributed computing environment, in which the aforementioned functional modules shown in FIG. 1 can be distributed over several local and/or remote devices, and can be linked through a communication network. It is further noted that in other embodiments at least some examination tools 101 and/or 102, data repositories 109, storage system 107 and/or GUI 108 can be external to the examination system 100 and operate in data communication with system 103 via input interface 105 and/or output interface 106. System 103 can be implemented as stand-alone computer(s) to be used in conjunction with the examination tools. Alternatively, the respective functions of the system can, at least partly, be integrated with one or more examination tools.

Figure 2:
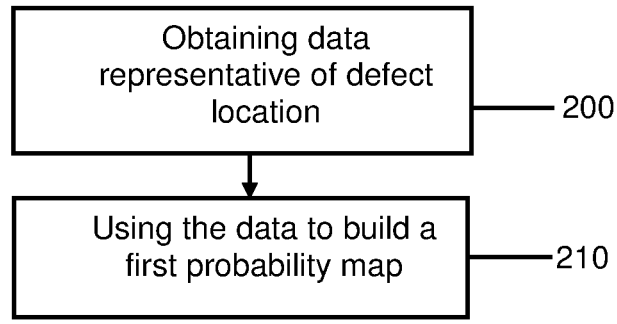
FIG. 2 illustrates a generalized flow-chart of a method of building a first probability map informative of locations of interest in the specimen.

Attention is now drawn to FIG. 2, which depicts a method of determining locations of interest in a semiconductor specimen. The method includes (operation 200) obtaining data representative of a defect location. According to some embodiments, the data can include an image of the semiconductor specimen acquired by an optical examination tool (see e.g. reference 101). In particular, according to some embodiments, a difference image between the optical image of the semiconductor specimen, and a reference image, can be generated, and locations of the difference image in which a difference in pixel intensity is above a threshold can be indicative of a location of interest (which can include a defect). As mentioned above, in various applications the optical signal is of low resolution, and therefore the difference image is generally not sufficient by itself to detect any defects. In some embodiments, the reference image is an image of another specimen, which is of the same type as the specimen under examination (indeed, distribution of defects can be modelled as a random distribution, therefore if a significant difference in pixel intensity exists between two specimens of the same type, this can be indicative of a defect). In some embodiments, the reference image is an image (simulated image or true image) of a specimen which is assumed to be without defects.

According to some embodiments, the data can include historical data regarding defect location (in particular for the type of specimen which is under examination). According to some embodiments, the data can include an image of the specimen acquired by an optical examination tool (see e.g. reference 101). Indeed, in some embodiments, although the optical examination tool does not provide an image with sufficient resolution to detect defects (e.g. in case of small structures), data provided by the optical examination tool can still include a first estimation of areas for which presence of defect(s) is suspected (thereby reducing the size of the areas to be considered in subsequent operations of the method of detecting defects). In some embodiments, data provided by the optical examination tool can correspond to images acquired using different wavelengths of the illumination beam. According to some embodiments, the data can include an image of the semiconductor specimen acquired by an electron beam examination tool (see e.g. reference 102). According to some embodiments, the data can include critical dimension uniformity (CDU) over one or more areas of the semiconductor specimen. During the fabrication process, a plurality of pattern features are formed in the substrate. Critical dimension (CD) includes e.g. gate width, the minimum width of a line, or the minimum space between two lines permitted in the manufacturing of the specimen. CDU characterizes variations of the critical dimension in an area of the specimen.

According to some embodiments, the data can include a simulated image of the semiconductor specimen. In particular, this can include design data, such as CAD data (provided e.g. by a user), which can include information regarding structured elements present in the specimen for which likelihood of presence of a defect is high ("CAD hotspot(s)"). According to some embodiments, the data can include a synthetic image of the semiconductor specimen. According to some embodiments, the data can include manufacturing data of the semiconductor specimen (e.g. temperature, pressure, type of gas, type of manufacturing tools). Indeed, manufacturing data can influence location of defects in the semiconductor specimen. Generally, the impact of variations of manufacturing data on the specimen has a dimension which is larger than the resolution of an optical examination tool.

The method can include using (210) the data to build a first probability map representing probability of a presence of defects over the specimen. In some embodiments, the data can be fed to a trained deep neural network (such as DNN 112), which can output, for each pixel, or area of pixels of the specimen, a first probability that a defect is present. The deep neural network can be pre-trained using supervised learning to provide the required map. During supervised learning, a label provided by an operator and indicative of the presence of defects is used together with a training set including data as obtained in operation 200. Use of a deep neural network to generate the first probability map is only a possible example, and other methods can be used, such as physical modelling (which involves the use of one or more statistical models). Based on this first probability map, it is possible to obtain a first estimate of the locations of interest in the specimen (these locations can correspond to locations in the first probability map for which the probability of presence of a defect is above a threshold), which should be further examined.

According to some embodiments, a plurality of images of the specimen can be acquired by an examination tool (such as optical examination tool 101), wherein the images differ by at least one acquisition parameter, such as the wavelength. As explained above, a difference image can be generated between the image of the specimen and a reference image. A difference image for each wavelength, together with other data representative of location of defects, can be used to build a first probability map per wavelength. In some embodiments, an aggregated first probability map can be built (e.g. by taking the maximum value for the probability for all wavelengths—other aggregations can be used to aggregate the plurality of first probability maps).

Figure 3:
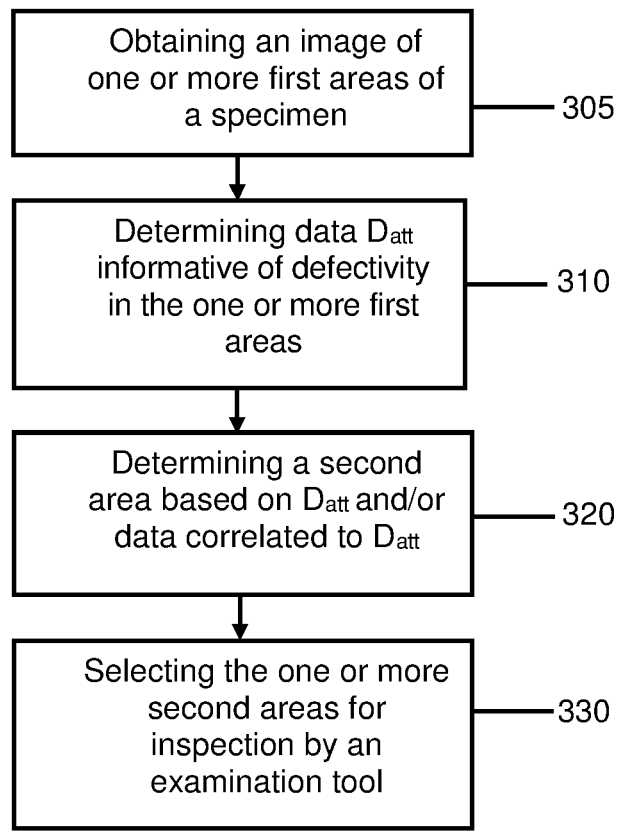
FIG. 3 illustrates a generalized flow-chart of a method of determining locations of interest in the specimen for inspection by an examination tool.

Attention is now drawn to FIG. 3. A method can include obtaining (305) an image of a first area of a specimen acquired by an examination tool. In some embodiments, the examination tool can be a high-resolution examination tool (see reference 102 in FIG. 1). According to some embodiments, the first area can be selected based on the first probability map that has been computed according to the method of FIG. 2. In particular, the first area can be selected as an area for which the probability map indicates that the probability of a presence of a defect is above a threshold.

According to some embodiments, operation 305 can include obtaining an image of each of a plurality of first areas of a semiconductor specimen acquired by an examination tool (such as examination tool 102). The plurality of first areas can be selected based on the probability map computed according to the method of FIG. 2. According to some embodiments, the plurality of first areas are selected such that they are sufficiently spread (in particular along the radial direction of the specimen). According to some embodiments, the plurality of first areas are selected such that thickness evolution of the specimen is different between at least some of the first areas, and/or such that thickness of the specimen in at least some of the first areas evolves and is not constant (as explained hereinafter, pixel intensity in an optical image is correlated to thickness and can be used to characterize thickness of the specimen). This allows increasing diversification of the information that is processed.

For a given first area, the method can include (310) determining data $D_{att}$ informative of defectivity (that is to say data informative of a presence of defect(s)) in the given area. Various examples of such data for one or more attributes are provided hereinafter. As explained hereinafter, $D_{att}$ can be particular in that defects tend to be present for values of $D_{att}$ which correspond to an extremum of $D_{att}$.

According to some embodiments, data $D_{att}$ in each of the one or more first areas is determined based on a plurality of optical images of the one or more first areas. The plurality of optical images can differ by the wavelength of the illuminating optical signal. Therefore, for each wavelength, different data $D_{att}$ can be obtained.

Data informative of defectivity in the one or more first areas can be obtained using various methods.

According to some embodiments, data representative of a shape of elements (e.g. structured elements such as contacts, transistors) present in the one or more first areas can be obtained. This can include e.g. data representative of the contour of the elements (e.g. line edge roughness LER, which refers to the non-smoothness of edges of elements present in the specimen), data representative of the surface of the elements, data representative of the perimeter of the elements, and data representative of the size of the elements. In some embodiments, this data can include critical dimension uniformity (CDU).

This various data can be obtained based on optical images previously acquired by an optical examination tool (such as examination tool 101) and/or based on the image acquired by the examination tool (which can be in particular examination tool 102) at operation 305. This data can be compared to reference data (design data such as CAD data, or to a reference image of a specimen without defects). If the difference is above a threshold, this can be indicative of the presence of a defect.

More generally, data representative of a difference between structured elements present in the one or more first areas, and structured elements present in a reference image of the given first area, can be used to detect defects. This can include e.g. a difference in the position (or orientation) of the structured elements in the one or more first areas with respect to a reference image of the one or more first areas.

In some embodiments, evolution of the data representative of a shape of the structured elements can be analysed within the one or more first areas. For example, if all structured elements have a similar shape (e.g. circular shape), and one structured element has a shape which is becoming different from a common average shape, or already has a different shape (e.g. ellipse), then this can be indicative of a defect. More generally, for other attributes which can be indicative of a defect, distribution of the values of the attribute in the one or more first areas can be computed, and deviation from a mean value can be detected.

The method can further include determining (320) one or more second areas of the semiconductor specimen for which presence of a defect is suspected, wherein a given second area is determined based at least on $D_{att}$ in the one or more first areas (or data correlated to $D_{att}$, as explained hereinafter).

Generally, data $D_{att}$ informative of defectivity (such as CDU, LER, etc.) is such that there is an extremum (which can be either a maximum or a minimum, or both, depending on the attribute) for which the probability to find a defect is the highest. It can be therefore attempted to find this extremum, or at least to tend towards this extremum. Since a plurality of values of $D_{att}$ has been obtained (e.g. for one or more areas over the specimen), the second area can be selected to attempt to move towards an extremum of $D_{att}$. According to some embodiments, selection of the one or more second areas can rely on methods such as (but not limited to) Gradient descent method, Newton's method, explore/exploit algorithms.

Figures 3A, 4:
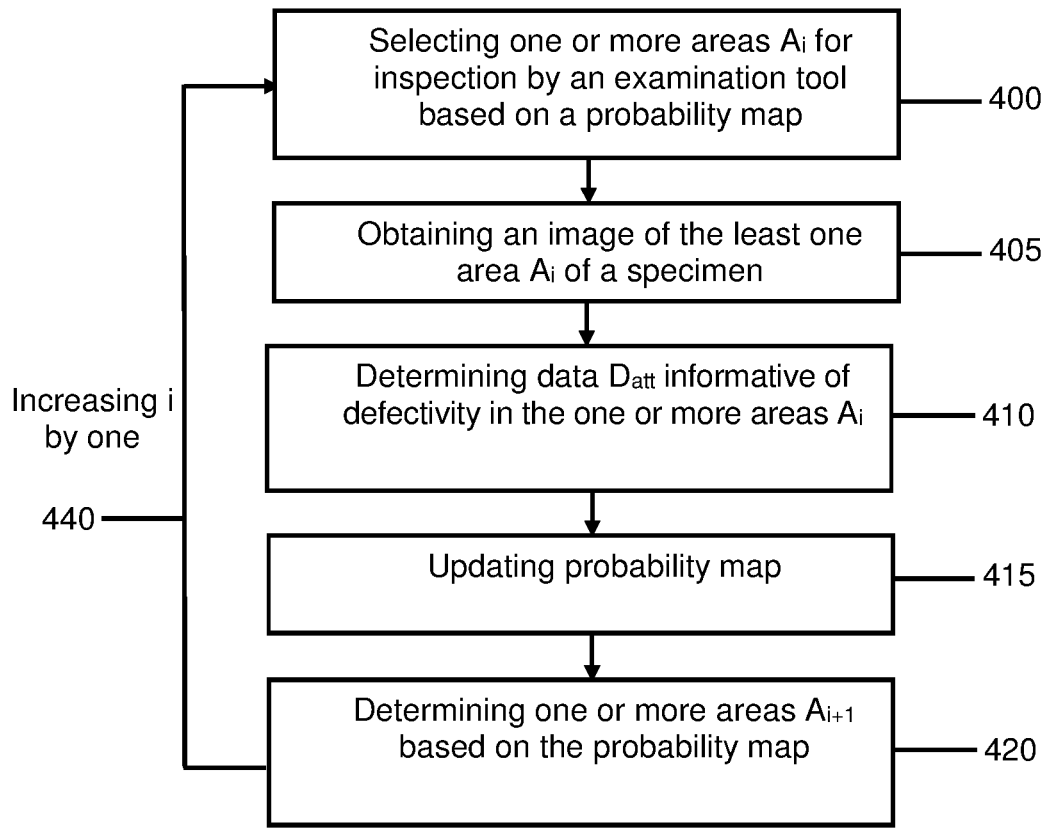
FIG. 3A illustrates a non-limitative example of a use of the method of FIG. 3 on a specimen.
FIG. 4 illustrates a generalized flow-chart of an iterative method of determining locations of interest in the specimen for inspection by an examination tool.

A simple (and non-limitative) example is illustrated in FIG. 3A. Assume that $D_{att}$ has been obtained for a given attribute informative of defectivity, for nine different areas of the specimen (areas 331 to 339). Assume that $D_{att}$ has a constant value for areas 334 to 339, but that value of $D_{att}$ decreases from area 331 to area 332, and increases again from area 332 to area 333. Therefore, if it is known that for the specific attribute for which $D_{att}$ has been computed, a minimum value corresponds to a high probability of finding a defect, this indicates that further acquisitions should be performed between areas 331 and 332. In particular, the method can be repeated, in order to acquire more values of $D_{att}$ at areas 340 and 341 (finer sampling), until a defect is found.

It has been mentioned with reference to FIG. 2 that a first probability map can be built, which indicates locations of interest for which there is a (serious) likelihood that a defect is present. According to some embodiments, operation 320 can include updating the first probability map based on $D_{att}$. In particular, areas for which it is expected that $D_{att}$ has a value which corresponds to an extremum (based on the trend of $D_{att}$ discovered at operation 310 in the one or more first areas) can get an increase of their probability, whereas other areas can get a decrease of their probability. The one or more second areas can be determined and selected based on the updated first probability map.

According to some embodiments, $D_{att}$ is determined separately at operation 310 in the one or more first areas for each of a plurality of different attributes (for example, $D_{att,1}$ corresponds to CDU, $D_{att,2}$ corresponds to LER, etc.). Each attribute can follows its own trend on the wafer. As a consequence, for each attribute, a different probability can be obtained that at a given location, a defect is present. An aggregated probability P can be computed for each pixel or area of pixels, e.g. by multiplying all probabilities determined for all attributes (this is not limitative, and other statistical formula can be used): $P=\Pi P_{attribute}$, wherein $P_{attribute}$ is the probability of finding a defect for a given attribute. In some embodiments, since $D_{att}$ can be computed for a plurality of different wavelengths, a plurality of probabilities that a defect is present at a given location can be obtained. As a consequence, an aggregated probability can be generated, using any adapted statistical formula, as explained above.

Once the one or more second areas have been identified, they can be selected (operation 330) for inspection by the examination tool. In particular, according to some embodiments, operation 330 can include generating an instruction for the examination tool, which instructs the examination tool to acquire an image of the one or more second areas. Based on the image of the one or more second areas, it is possible to detect whether the second area includes a defect. For example, if the examination tool is a high-resolution examination tool (such as an electron beam microscope 102), then it can output a clear-cut decision on whether or not a defect is present.

According to some embodiments, the method of FIG. 3 can be repeated iteratively, until a stopping criterion is met. This is illustrated in FIG. 4.

The method includes selecting (operation 400) at least one area $A_i$ of the semiconductor specimen for inspection by an examination tool and obtaining (operation 405) an image of the at least one area $A_i$ acquired by the examination tool. Operation 405 is similar to operation 305. At the first iteration (for i=1), $A_i$ can be selected based on the first probability map computed as explained with reference to FIG. 2.

The method includes determining (operation 410) data $D_{att}$ informative of defectivity in the one or more areas $A_i$. Operation 410 is similar to operation 310. The method can include, in some embodiments, updating (415) the probability map (currently in use) based on $D_{att}$.

The method includes determining (operation 420) one or more areas $A_{i+1}$. This can be performed based e.g. on the probability map (and/or based on $D_{att}$). Operation 420 can be similar to operation 320. The one or more areas $A_{i+1}$ can then be selected for inspection by the examination tool.

The method can then be repeated (see reference 440). At the next iteration, $D_{att}$ of the one or more areas $A_{i+1}$ is computed and helps to determine whether the trend determined for $D_{att}$ in the one or more areas $A_i$ pursues in the newly selected area(s) $A_{i+1}$.

According to the method of FIG. 4, a first rough sampling is therefore performed to detect a general trend of $D_{att}$ (for one or more attributes) over the specimen, and, during subsequent iterations, a finer sampling of the values of $D_{att}$ is performed on specific areas of the specimen, in order to attempt to tend towards an extremum (minimum and/or maximum depending on the attribute) of $D_{att}$, for which there is a high probability to find a defect.

According to some embodiments, update of the probability map at operation 415 (to obtain updated probability $P_{new}$ for each pixel or areas of pixels of the probability map) can include performing a weighted combination between previous probability ($P_{prev}$ obtained at previous iteration "i") and current probability ($P_{curr}$ obtained at iteration "i+1"). According to some embodiments, the following formula can be used (this is not limitative—α is a weight selected e.g. by an operator):

$$P_{new}=\alpha P_{prev}+(1-\alpha)P_{curr}$$

During iterations of the method of FIG. 4, it is expected that, at some stage, output of the examination tool indicates presence of a defect in a selected area $A_k$ (for some value of k). In other words, use of $D_{att}$ has been fruitful to converge and find a defect.

Figure 5:
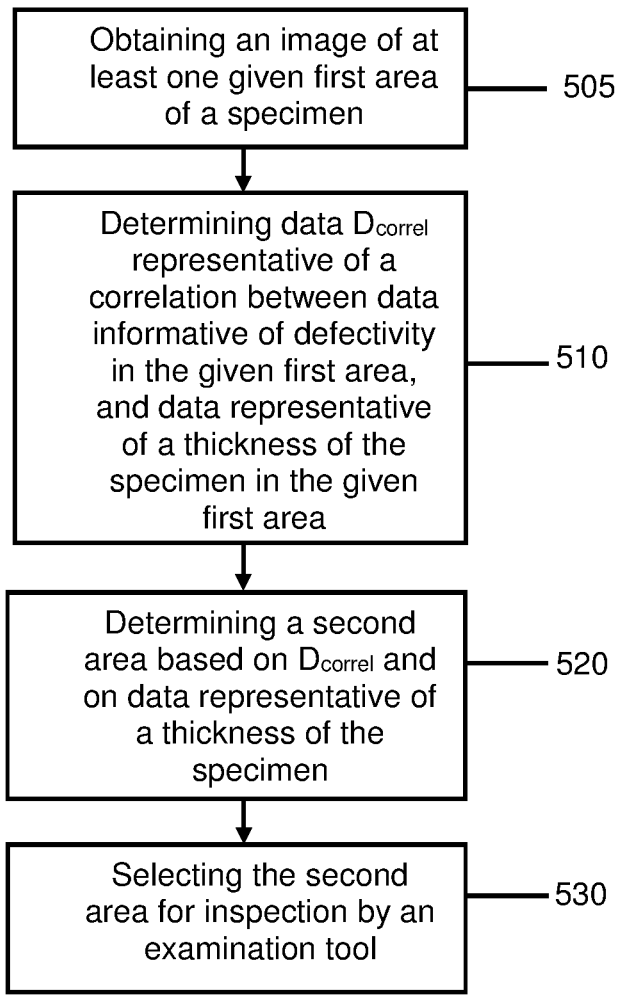
FIG. 5 illustrates a generalized flow-chart of another possible embodiment of the method of FIG. 3.

Attention is now drawn to FIG. 5, which describes another possible implementation of the method of FIG. 3. In particular, in FIG. 3, it has been mentioned that selection of the one or more second areas can be performed based on data correlated to $D_{att}$. FIG. 5 illustrates a possible embodiment of this method.

The method includes obtaining an image of at least one given first area (or a plurality of given first areas) of a specimen (operation 505, similar to operation 305).

The method further includes determining (operation 510) data $D_{correl}$ representative of a correlation between data $D_{att}$ informative of defectivity in the given first area, and data representative of a thickness of the specimen in the given first area. In some embodiments, operation 310 can be performed on a plurality of the given first areas, or on all of the given first areas. Various examples have already been provided for $D_{att}$ and can be used in this method.

According to some embodiments, data representative of a thickness of the specimen in the given first area can be obtained in particular based on an image of the given first area acquired by an optical examination tool (see e.g. reference 101). Indeed, the thickness of the specimen (which can include one or more layers) has an impact on the diffraction of the optical signal, and therefore, on the pixel intensity in the optical image. Depending on the wavelength of the illuminating optical signal, in some cases, the higher the thickness of the specimen, the higher the intensity ("grey level") of the corresponding pixel(s) in the optical image (positive correlation), and in other cases, the lower the thickness of the specimen, the higher the intensity ("grey level") of the corresponding pixel(s) in the optical image (negative correlation).

Since pixel intensity in an optical image of the specimen is correlated to the thickness of the specimen, the pixel intensity can be used as data representative of the thickness of the specimen. It is not necessary to determine the relationship between pixel intensity and the thickness of the specimen, since this relationship is not necessary known or available: it is sufficient to know that the pixel intensity in the optical image is representative of the thickness of the specimen.

Figure 5A:
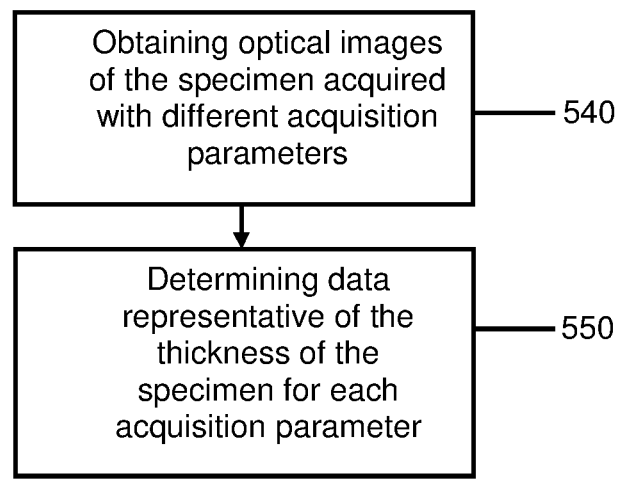
FIG. 5A illustrates a generalized flow-chart of a method of determining data representative of thickness of a specimen based on a plurality of images which differ by at least one acquisition parameter.

According to some embodiments, data representative of a thickness of the specimen in the given first area is determined based on a plurality of optical images of the given first area. This is illustrated in FIG. 5A. The plurality of optical images (acquired at operation 340) can differ by the wavelength of the illuminating optical signal. Distribution of the pixel intensity of the given first area in each of the plurality of optical images is generally different. Indeed, since each optical signal has a different wavelength, a different level of diffraction is obtained and therefore, for each wavelength, a different pixel intensity distribution is obtained, each representative of the thickness distribution.

As mentioned above, operation 510 includes determining data $D_{correl}$ between first data (data informative of defectivity in the given first area) and second data (data representative of a thickness of the semiconductor specimen in the given first area—in practice, as mentioned above, pixel intensity in an optical image can be used to characterize thickness of the specimen). Indeed, it is expected that there is a correlation between the thickness of the specimen and the probability that a defect is present. This correlation has been observed experimentally.

Assume that data $D_{att}$ informative of defectivity in the given first area is represented by variable Z, pixel intensity in the optical image is represented by variable Y, and data representative of a thickness of the semiconductor specimen in the given first area is represented by variable X. Determining data $D_{correl}$ can include determining a function F, such as Z=F(Y). Since it is known that there Y is correlated to X, this is equivalent to determining Z=G(X). As explained hereinafter, for some types of attributes Z, the higher the value of Z, the higher the probability of finding a defect, and for other types of attributes Z, the lower the value of Z, the higher the probability of finding a defect.

According to some embodiments, F can be determined using e.g. methods such as interpolation (a non-limitative example includes linear regression), or other statistical methods. Assume that for a given attribute representative of a defect in the given first area (e.g. CDU), a plurality of pairs of values can be obtained (Z=value of the attribute; Y=pixel intensity). As a consequence, a function F can be obtained for this attribute. According to some embodiments, for each attribute representative of a defect, a function $F_{attribute}$ can be determined separately.

The method can further include determining (520) one or more second areas of the semiconductor specimen for which presence of a defect is suspected, wherein the one or more second areas are determined based on $D_{correl}$ (or data representative thereof, such as a defect probability generated based on $D_{correl}$) and data representative of a thickness of the specimen. In practice, as mentioned above, value of the thickness is generally not directly available, and the pixel intensity in an optical image can be used to represent thickness.

Indeed, F (or $F_{attribute}$), which are part of $D_{correl}$, can be used to determine for which values of the pixel intensity (and in turn of the thickness) and/or for which evolution of the pixel intensity (and in turn of the thickness), there is a probability that a defect is present at the given location. For example, if the attribute is such that a high value of the attribute corresponds to a high probability of finding a defect, then the pixel intensity associated with the high value of $F_{attribute}$ can be determined, and can be used to select the second area. For example, if the attribute is CDU, it is expected that the higher the value of CDU, the higher the probability of finding a defect. This is not limitative, and for other attributes, a low value of the attribute can correspond to a high probability of finding a defect.

Since data representative of a thickness of the specimen is available (e.g. based on an optical image of the specimen), and $D_{correl}$ characterizes the relationship between the thickness of the specimen (through the pixel intensity) and data informative of defectivity, the second area can be selected as an area for which pixel intensity (and therefore thickness of the specimen) is expected to reflect the presence of a defect. The second area can be selected (operation 530) for being inspected by the examination tool, in order to confirm whether the second area includes a defect.

It has been mentioned with reference to FIG. 2 that a first probability map can be built, which indicates locations of interest for which there is a (serious) likelihood that a defect is present. According to some embodiments, operation 520 can include updating the first probability map based on $D_{correl}$ and data representative of a thickness of the specimen. In other words, $D_{correl}$ can be used to compute a probability that a defect is present (even if the area has not been acquired by the examination tool 102). In particular, areas which have a pixel intensity (e.g. value of the pixel intensity, and/or pixel intensity evolution) for which $D_{correl}$ indicates a high probability that a defect is present, will get an increase of their probability, whereas areas which have a pixel intensity for which $D_{correl}$ indicates a low probability that a defect is present, will get a decrease of their probability. The one or more second areas can be determined and selected based on the updated probability map.

For example, assume that $D_{correl}$ indicates a high probability of defects for specific values of pixel intensity (e.g. in range $[Y_1;Y_2]$). Then, the second area can be selected such that its pixel intensity is located in this range. In some embodiments, the pixels (which belong to the first probability map) can be clustered into a plurality of clusters based on pixel intensity, and therefore, the cluster of pixels which is the closest to the selected range of pixel intensity will get a high probability.

As mentioned above, according to some embodiments, a function F (or $F_{attribute}$) representative of the correlation between value of the attribute (representative of location of a defect) and pixel intensity is determined for each of a plurality of attributes. Update of the first probability map can include determining, for each pixel or area of pixels of the map, a probability $P_{attribute}$ that a defect is present based on $F_{attribute}$ and on the pixel intensity (representative of the thickness of the specimen). A non-limitative example of modelling of the probability can include:

$$P_{attribute}(Y|\mu, \sigma) = \frac{1}{\sqrt{2\pi}\,\sigma} e^{-\frac{(Y-\mu)^2}{2\sigma^2}}.$$

In this expression, Y is the pixel intensity in an optical image (representative of the thickness). $\mu$ can be determined based on $F_{attribute}$ obtained for this attribute. For example, if $F_{attribute}$ indicates that for a given value Y* of the pixel intensity, the probability to find a defect is high (and decreases when moving away from Y*), then $\mu$ can be selected such that $\mu$=Y*.

An aggregated probability P can be computed for each pixel or area of pixels, e.g. by multiplying all probabilities determined for all attributes (this is not limitative, and other statistical formula can be used): $P = \subset P_{attribute}$.

According to some embodiments, the second area can be selected in order to test the function F (or $P_{attribute}$) obtained at the previous iteration (for the first area). For example, if the function F indicates high probability of defect in a range R of pixel intensity (representative of thickness), then the second area can be selected with a pixel intensity in this range. In other examples, if the function F indicates high probability of defect in a range R of pixel intensity (representative of thickness), then the second area can be selected with a pixel intensity in a range R' different from this range R (e.g. R' can include R).

As explained above, generally, data indicative of a presence of a defect (such as CDU, LER, etc.) is such that there is an extremum (which can be either a maximum and/or a minimum, depending on the attribute) for which the probability to find a defect is the highest. It can be therefore attempted to find this extremum, or at least to tend towards this extremum. The second area can be selected to attempt to move towards an extremum of an output of the function F. For example, for CDU, it is expected that CDU will have a high value in a defective area, and therefore a maxima is to be found.

Figure 5B:
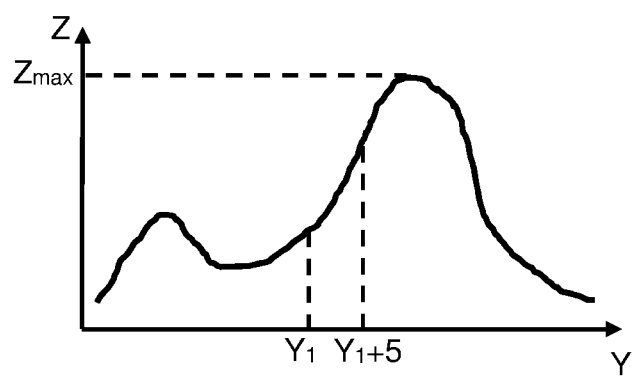
FIG. 5B illustrates an example of a function correlating data indicative of a presence of a defect in an area and pixel intensity (which is representative of thickness).

Assume that the function F indicates a high probability of presence of a defect (reflected by the value of Z=F(Y)) when pixel intensity increases from $Y_1$ to $Y_1+5$ (see the example of FIG. 5B—in this example, the higher the value of the attribute, the higher the probability of a defect). It can be attempted to check whether this trend is indeed representative of a defect, by selecting a second area for which pixel intensity evolves from $Y_1+5$ to $Y_1+10$ and/or by selecting an area for which the pixel intensity is already equal to $Y_1+10$. In other words, it is attempted to check whether the trend identified at the previous iteration is correct, in order to hopefully reach an extremum (in FIG. 5B, $Z_{max}$) of Z.

In some embodiments, probability assigned to the pixel areas (in the probability map as mentioned above) for which the pixel intensity follows the relationship mentioned above can be increased, thereby increasing prospects that these areas will be selected at the next iteration.

Figure 5C:
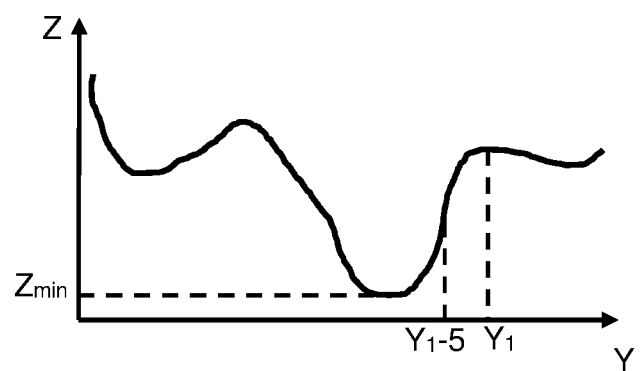
FIG. 5C illustrates another example of a function correlating data indicative of a presence of a defect in an area and pixel intensity (which is representative of thickness).

Similarly, assume that the function F for another attribute indicates a high probability of presence of a defect (reflected by the value of Z=F(Y)) when the pixel intensity decreases from $Y_1$ to $Y_1-5$ (see FIG. 5C—in this example, the lower the value of the attribute, the higher the probability of a defect). It can be attempted to check whether this trend is indeed representative of a defect, by selecting a second area for which the pixel intensity evolves from $Y_1-5$ to $Y_1-10$, and/or by selecting an area for which the thickness is already equal to $Y_1-10$. In other words, it is attempted to check whether the trend identified at the previous iteration is correct, in order to hopefully reach an extremum of Z (in FIG. 5C, $Z_{min}$).

According to some embodiments, selection of the second area (in order to check validity of the correlation function determined at the previous iteration of the method) can rely on methods such as Gradient descent method, Newton's method, explore/exploit algorithms (explore/exploit algorithms are particularly useful when the function includes a plurality of local extrema).

It has been mentioned with reference to FIG. 5A that according to some embodiments, a plurality of images which differ by at least one acquisition parameter (such as wavelength) can be obtained. Therefore, for each acquisition parameter, a different distribution of pixel intensity is obtained, and $D_{correl}$ can be computed independently for each acquisition parameter. According to some embodiments, a different probability map can be obtained for each acquisition parameter, and the second area can be selected e.g. as the area for which the probability is the highest among all different probability maps.

Once the second area has been identified, it can be selected (operation 530) for inspection by the examination tool, as explained with reference to operation 330.

Figure 6:
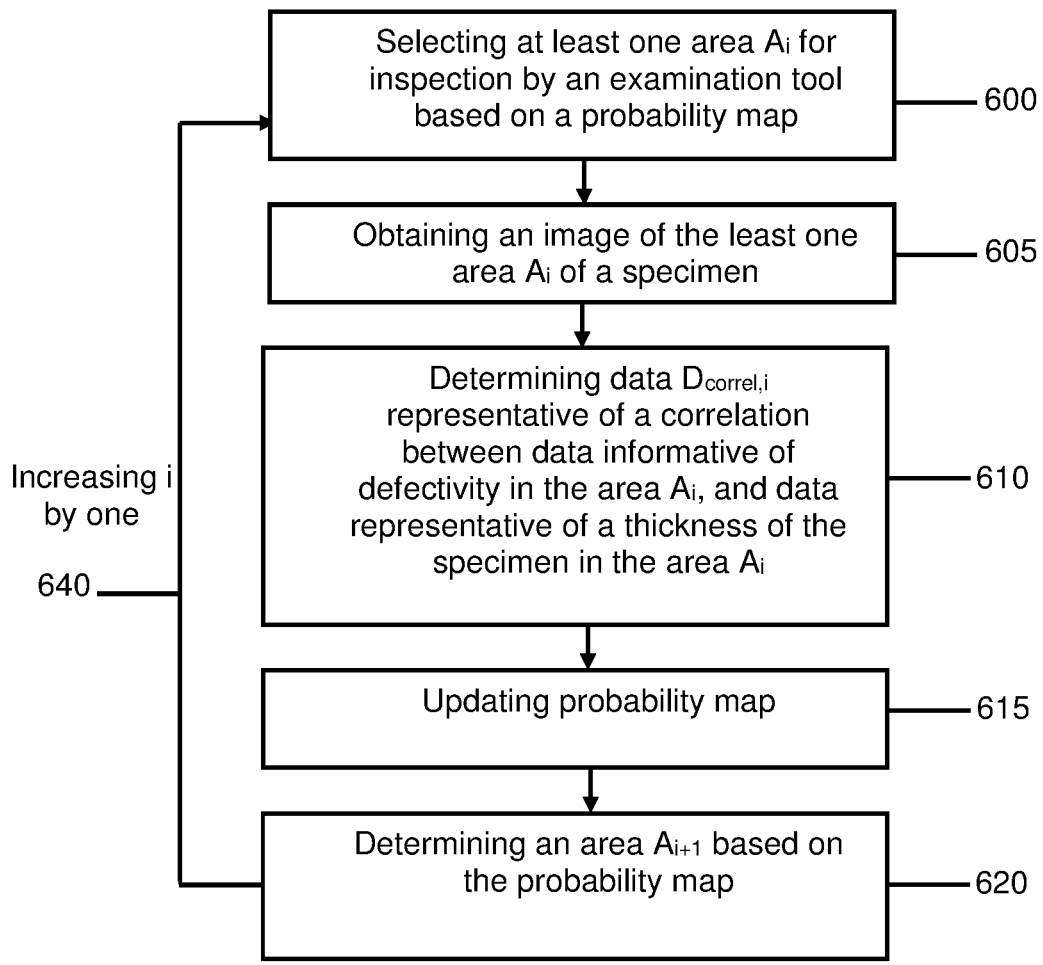
FIG. 6 illustrates a generalized flow-chart of the method of FIG. 5 applied iteratively.

According to some embodiments, the method of FIG. 5 can be repeated iteratively, until a stopping criterion is met. This is illustrated in FIG. 6.

The method includes selecting (operation 600) at least one area $A_i$ of the semiconductor specimen for inspection by an examination tool and obtaining (operation 605) an image of the at least one area $A_i$ acquired by the examination tool. Operation 605 is similar to operation 505. At the first iteration (for i=1), $A_i$ can be selected based on the first probability map computed as explained with reference to FIG. 2.

The method includes determining (operation 610) data $D_{correl,i}$ representative of a correlation between data $D_{att}$ informative of defectivity in the area $A_i$, and data representative of a thickness of the specimen in the area $A_i$ (in particular, pixel intensity is representative of a thickness of the specimen in the area $A_i$). Operation 610 is similar to operation 610. The method can include, in some embodiments, updating (615) the probability map (currently in use) based on $D_{correl,i}$.

The method includes determining (operation 620) at least one area $A_{i+1}$. This can be performed based e.g. on the probability map (and/or based on $D_{correl,i}$ and on data representative of a thickness of the specimen). Operation 620 can be similar to operation 520. The area $A_{i+1}$ can then be selected for inspection by the examination tool.

The method can then be repeated (see reference 640). At the next iteration, $D_{correl,i+1}$ of area $A_{i+1}$ is computed and helps to determine whether the trend (and/or specific values of pixel intensity) determined in $D_{correl,i}$ as representative of a defect, is correct.

For example, assume that $D_{correl,i}$ indicates that for a range of pixel intensity $[Y_1;Y_2]$ there is a high probability of finding a defect, and that $D_{correli,i+1}$ confirms this hypothesis. Then the probability map can be updated (operation 615) to further increase the probability assigned to areas of pixels which have a thickness located in this range.

In another example, assume that $D_{correl,i}$ indicates that for a range of pixel intensity $[Y_3;Y_4]$ there is a high probability of finding a defect, and that $D_{correll,i+1}$ contradicts this hypothesis. Then the probability map can be updated (operation 615) to reduce the probability assigned to areas of pixels which have a pixel intensity located in this range.

In another example, assume that $D_{correl,i}$ indicates that a particular gradient or trend in the pixel intensity (and in turn of the thickness) is indicative of a defect. As mentioned above, $A_{i+1}$ can be selected in order to test whether this gradient or trend in the pixel intensity is actually indicative of a defect.

If $D_{correl,i+1}$ (representative of a correlation between data indicative of a presence of a defect in the area $A_{i+1}$ and data representative of a thickness of the specimen in the area $A_{i+1}$) confirms that the gradient or trend in the pixel intensity (and in turn of the thickness) as present in $D_{correl,i}$ is indicative of a defect, then the probability map can be updated (operation 615) to increase probability assigned to areas of pixels which have a pixel intensity which follows the gradient or trend as described in $D_{correl,i}$ and $D_{correl,i+1}$.

If $D_{correl,i+1}$ (representative of a correlation between data indicative of a presence of a defect in the area $A_{i+1}$ and data representative of a thickness of the specimen in the area $A_{i+1}$) indicates that the gradient or trend in the pixel intensity as present in $D_{correl,i}$ is not indicative of a defect, then the probability map can be updated (operation 615) to reduce probability assigned to areas of pixels which have a pixel intensity which follows a gradient or trend as described in $D_{correl,i}$. The correct gradient or trend indicative of a defect can be found e.g. after several subsequent iterations.

According to some embodiments, update of the probability map at operation 615 (to obtain updated probability $P_{new}$ for each pixel or areas of pixels of the probability map) can include performing a weighted combination between previous probability ($P_{prev}$ obtained at previous iteration "i") and current probability ($P_{curr}$ obtained at iteration "i+1"), as already explained with reference to FIG. 4.

During iterations of the method of FIG. 6, it is expected that, at some stage, output of the examination tool indicates presence of a defect in a selected area $A_k$ (for some value of k). In other words, use of $D_{correl}$ has been fruitful to converge and find a defect. According to some embodiments, data $D_{Ak}$ representative of the thickness of this area $A_k$ can be used to update the probability map. In particular, since a defect has been detected in this area $A_k$, the probability map can be updated, such that any area of pixels for which pixel intensity includes values and/or evolves similarly to $D_{Ak}$, (e.g. according to a similarity criterion, which can include a threshold), is assigned with a high probability (e.g. close to one). As a consequence, during a future iteration of the method (see reference 640 which depicts such iteration), these areas of pixels will be selected (operation 600) for inspection by the examination tool, thereby increasing the prospects to determine additional defects.

According to some embodiments, there is a limitation on the number of areas that can be acquired by the examination tool. This limitation can be due e.g. to time and/or cost constraints. This limitation is encountered in particular for a high-resolution examination tool, such as examination tool 102 (e.g. electron beam microscope). As a consequence, not all areas can be acquired by the examination tool. Since a probability map has been computed based on $D_{correl}$ and data representative of a thickness of the semiconductor specimen in the one or more areas, it is possible to output a probability that the one or more areas include a defect without requiring acquisition of an image of the one or more areas by the examination tool. In particular, the one or more areas for which the probability that a defect is present is above a threshold can be output (although, in practice the high-resolution examination tool has not acquired an image of these areas).

According to some embodiments, $D_{correl}$ and/or the probability map can be determined on a first specimen, and can be used for other specimens (which are similar to the first specimen, e.g. same type of wafer, or same manufacturing process) to select locations to be examined by the examination tool (e.g. 102). In some embodiments, locations for which a high probability of defects has been found in the first specimen, can be examined in the subsequent similar specimens. In some embodiments, $D_{correl}$ and/or the probability map is informative of a probability that a defect is present based on pixel intensity (which reflects thickness evolution). It is therefore possible to determine locations of interest in the subsequent similar specimens based on distribution of pixel intensity, without requiring acquisition by the examination tool (e.g. 102) of the whole specimen.

It is to be understood that the invention is not limited in its application to the details set forth in the description contained herein or illustrated in the drawings.

It will also be understood that the system according to the invention may be, at least partly, implemented on a suitably programmed computer. Likewise, the invention contemplates a computer program being readable by a computer for executing the method of the invention. The invention further contemplates a non-transitory computer-readable memory tangibly embodying a program of instructions executable by the computer for executing the method of the invention.

The invention is capable of other embodiments and of being practiced and carried out in various ways. Hence, it is to be understood that the phraseology and terminology employed herein are for the purpose of description and should not be regarded as limiting. As such, those skilled in the art will appreciate that the conception upon which this disclosure is based may readily be utilized as a basis for designing other structures, methods, and systems for carrying out the several purposes of the presently disclosed subject matter.

Those skilled in the art will readily appreciate that various modifications and changes can be applied to the embodiments of the invention as hereinbefore described without departing from its scope, defined in and by the appended claims.

What is claimed is:

1. A system of examination of a semiconductor specimen, the system comprising a processor and memory circuitry (PMC) configured to:
   obtain an image of one or more first areas of a semiconductor specimen acquired by an examination tool;
   determine data $D_{att}$ informative of defectivity in the one or more first areas;
   determine a probability of presence of a defect in a plurality of areas of the specimen, using a probability model informative of a spatial distribution of defectivity in at least part of the specimen and data informative of the first areas comprising at least one of:
      a spatial trend of data $D_{att}$ informative of defectivity in the one or more first areas;
      a spatial trend of data correlated to $D_{att}$ in the one or more first areas,
   wherein at least one of the plurality of areas differs from the one or more first areas;
   using at least part of said probability of presence of a defect in the plurality of areas to select, among said plurality of areas of the specimen, one or more second areas of the semiconductor specimen for which presence of a defect is suspected, for inspection by the examination tool, wherein said probability of presence of a defect determined for the plurality of areas using data informative of the first areas enables selection of the one or more second areas before acquisition of an image of the one or more second areas by the examination tool.

2. The system of claim 1, wherein determination of the one or more second areas is based on a search of an extremum of $D_{att}$.

3. The system of claim 1, configured to:
   determine $D_{correl}$ representative of a correlation between:
   data $D_{att}$ informative of defectivity in the one or more first areas; and
   data representative of a thickness of the semiconductor specimen in the one or more first areas;
   determine one or more second areas of the semiconductor specimen for which presence of a defect is suspected, wherein the one or more second areas are determined based on $D_{correl}$, or data representative thereof, and data representative of a thickness of the semiconductor specimen; and
   select the one or more second areas for inspection by the examination tool.

4. The system of claim 3, wherein if data $D_{correl}$ includes a function F which depends on data representative of a thickness of the semiconductor specimen over a range R, the system is configured to select the second area such that at least one of (i), (ii) and (iii) is met:
   (i) data representative of a thickness of the semiconductor specimen in the second area complies with the function F in the range R;
   (ii) data representative of a thickness of the semiconductor specimen in the second area allows testing the function F over a range R' different from R; and
   (iii) data representative of a thickness of the semiconductor specimen in the second area is selected to attempt to move towards an extremum of an output of the function F.

5. The system of claim 3, wherein:
   at least one of data representative of a thickness of the semiconductor specimen in the one or more first areas, and data representative of a thickness of the semiconductor specimen, is obtained based on pixel intensity in an image acquired by at least one optical examination tool; or
   at least one of data representative of a thickness of the semiconductor specimen in the one or more first areas and data representative of a thickness of the semiconductor specimen is obtained based on pixel intensity in a plurality of images acquired by at least one optical examination tool, wherein the plurality of images differs by a wavelength of an illuminating optical signal of the optical examination tool.

6. The system of claim 3, wherein said determination of the one or more second areas is enabled even when an image of the one or more second areas by the examination tool is not yet available.

7. The system of claim 3, configured to output data representative of a probability that a defect is present in one or more areas of the semiconductor specimen, or of another semiconductor specimen, based on data representative of a thickness of the semiconductor specimen, or the another semiconductor specimen, in the one or more areas, without requiring acquisition of an image of the one or more areas by the examination tool.

8. The system of claim 1, configured to perform repeatedly (1), (2), (3) and (4), from i equal to 1, until a stopping criterion is met:
   (1) obtain an image of one or more areas $A_i$ of a semiconductor specimen acquired by an examination tool;
   (2) determine data $D_{att}$ informative of defectivity in the one or more areas $A_i$;
   (3) determine one or more areas $A_{i+1}$ of the semiconductor specimen for which presence of a defect is suspected, based at least on an evolution of $D_{att}$ in the one or more areas $A_i$; and
   (4) reverting to (1) for i incremented by one.

9. The system of claim 1, configured to perform repeatedly (1), (2), (3) and (4), from i equal to 1, until a stopping criterion is met:
   (1) obtain an image of an area $A_i$ of a semiconductor specimen acquired by an examination tool;
   (2) determine data $D_{correl,i}$ representative of a correlation between:
   data $D_{att}$ informative of defectivity in the area $A_i$; and
   data representative of a thickness of the semiconductor specimen in the area $A_i$;
   (3) determine one or more areas $A_{i+1}$ of the semiconductor specimen for which presence of a defect is suspected, wherein the one or more areas $A_{i+1}$ are determined based at least on $D_{correl,i}$, or data representative thereof, and data representative of a thickness of the semiconductor specimen; and
   (4) reverting to (1) for i incremented by one.

10. The system of claim 1, wherein the probability is based on at least one of and (i) and (ii):
    (i) data $D_{att}$ informative of defectivity in the one or more first areas; and
    (ii) data $D_{correl}$ representative of a correlation between data $D_{att}$ informative of defectivity in the one or more first areas and data representative of a thickness of the semiconductor specimen in the one or more first areas, and data representative of a thickness of the semiconductor specimen.

11. The system of claim 1, configured to:
    obtain an image of one or more first areas of a semiconductor specimen acquired by an examination tool;
    determine data Datt informative of defectivity in the one or more first areas;
    determine a probability of presence of a defect in a plurality of areas of the specimen, using a probability model, a model of the specimen and at least one of:
    an evolution of data Datt informative of defectivity in the one or more first areas; and
    an evolution of data correlated to Datt in the one or more first areas;
    wherein at least one of the plurality of areas differs from the one or more first areas,
    determine, among said plurality of areas of the specimen, one or more second areas for which presence of a defect is suspected;
    select the one or more second areas for inspection by the examination tool; and
    determine presence of defects within the one or more second areas and use said determination to update the model of the specimen.

12. The system of claim 1, configured to select the one or more first areas based on a first probability map representing probability of a presence of defects over the semiconductor specimen, wherein the first probability map is built based on at least one of:

an image of the semiconductor specimen acquired by an optical examination tool;

estimation of defect location based on an image of the semiconductor specimen acquired by an optical examination tool;

historical data regarding defect location;

an image of the semiconductor specimen acquired by an electron beam examination tool;

a simulated image of the semiconductor specimen;

a synthetic image of the semiconductor specimen; and manufacturing data of the semiconductor specimen.

13. A method of examination of a semiconductor specimen, the method comprising, by a processor and memory circuitry (PMC):

obtaining an image of one or more first areas of a semiconductor specimen acquired by an examination tool;

determining data $D_{att}$ informative of defectivity in the one or more first areas;

determining a probability of presence of a defect in a plurality of areas of the specimen, using a probability model informative of a spatial distribution of defectivity in at least part of the specimen, and data informative of the first areas comprising at least one of:

a spatial trend of data $D_{att}$ informative of defectivity in the one or more first areas;

a spatial trend of data correlated to $D_{att}$ in the one or more first areas;

wherein at least one of the plurality of areas differs from the one or more first areas;

using at least part of said probability of presence of a defect in the plurality of areas to select, among said plurality of areas of the specimen, one or more second areas of the semiconductor specimen for which presence of a defect is suspected, wherein said probability of presence of a defect determined for the plurality of areas using data informative of the first areas enables selection of the one or more second areas before acquisition of an image of the one or more second areas by the examination tool; and selecting the one or more second areas for inspection by the examination tool.

14. The method of claim 13, wherein determination of the one or more second areas is based on a search of an extremum of $D_{att}$.

15. The method of claim 13, including performing repeatedly (1), (2), (3) and (4), from i equal to 1, until a stopping criterion is met:

(1) obtaining an image of one or more areas $A_i$ of a semiconductor specimen acquired by an examination tool;

(2) determining data $D_{att}$ informative of defectivity in the one or more areas $A_i$;

(3) determining one or more areas $A_{i+1}$ of the semiconductor specimen for which presence of a defect is suspected, based at least on an evolution of $D_{att}$ in the one or more areas $A_i$; and (4) reverting to (1) for i incremented by one.

16. The method of claim 13, including performing repeatedly (1), (2), (3) and (4), from i equal to 1, until a stopping criterion is met:

(1) obtaining an image of an area $A_i$ of a semiconductor specimen acquired by an examination tool;

(2) determining data $D_{correl,i}$ representative of a correlation between:

data $D_{att}$ informative of defectivity in the area $A_i$; and data representative of a thickness of the semiconductor specimen in the area $A_i$;

(3) determining one or more areas $A_{i+1}$ of the semiconductor specimen for which presence of a defect is suspected, wherein the one or more areas $A_{i+1}$ are determined based at least on $D_{correl,i}$, or data representative thereof, and data representative of a thickness of the semiconductor specimen; and (4) reverting to (1) for i incremented by one.

17. The method of claim 16, wherein at least one of data representative of a thickness of the semiconductor specimen in the area $A_i$, and data representative of a thickness of the semiconductor specimen, is obtained based on pixel intensity in a plurality of images acquired by at least one optical examination tool, wherein the plurality of images differs by a wavelength of an illuminating optical signal of the optical examination tool.

18. The method of claim 13, wherein the probability is based on at least one of and (i) and (ii):

(i) data $D_{att}$ informative of defectivity in the one or more first areas; and (ii) data $D_{correl}$ representative of a correlation between data $D_{att}$ informative of defectivity in the one or more first areas and data representative of a thickness of the semiconductor specimen in the one or more first areas, and data representative of a thickness of the semiconductor specimen.

19. The method of claim 13, wherein data $D_{att}$ in the one or more first areas includes at least one of:

data representative of a shape of elements present in the one or more first areas;

data representative of a dimension of elements present in the one or more first areas; and data representative of a difference between elements present in the one or more first areas and elements present in a reference image of the one or more first areas.

20. A non-transitory computer readable medium comprising instructions that, when executed by a processor, cause the processor to perform operations comprising:

obtaining an image of one or more first areas of a semiconductor specimen acquired by an examination tool;

determining data $D_{att}$ informative of defectivity in the one or more first areas;

determining a probability of presence of a defect in a plurality of areas of the specimen, using a probability model informative of a spatial distribution of defectivity in at least part of the specimen and data informative of the first areas comprising at least one of:

a spatial trend of data $D_{att}$ informative of defectivity in the one or more first areas;

a spatial trend of data correlated to $D_{att}$ in the one or more first areas, wherein at least one of the plurality of areas differs from the one or more first areas;

using at least part of said probability of presence of a defect in the plurality of areas to determine, among said plurality of areas of the specimen, one or more second areas of the semiconductor specimen for which presence of a defect is suspected, wherein said probability of presence of a defect determined for the plurality of areas using data informative of the first areas enables selection of the one or more second areas before acquisition of an image of the one or more second areas by the examination tool; and selecting the one or more second areas for inspection by the examination tool.

\* \* \* \* \*